United States Patent
Tachibana

(10) Patent No.: US 10,971,663 B2
(45) Date of Patent: Apr. 6, 2021

(54) SEMICONDUCTOR LIGHT EMITTING DEVICE

(71) Applicant: STANLEY ELECTRIC CO., LTD., Tokyo (JP)

(72) Inventor: Kaori Tachibana, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 198 days.

(21) Appl. No.: 15/800,495

(22) Filed: Nov. 1, 2017

(65) Prior Publication Data

US 2018/0130930 A1     May 10, 2018

(30) Foreign Application Priority Data

Nov. 8, 2016   (JP) .............................. JP2016-218246
Nov. 8, 2016   (JP) .............................. JP2016-218250

(51) Int. Cl.
  *H01L 33/56*    (2010.01)
  *H01L 33/50*    (2010.01)
  *H01L 33/60*    (2010.01)

(52) U.S. Cl.
  CPC ............ *H01L 33/505* (2013.01); *H01L 33/56* (2013.01); *H01L 33/60* (2013.01); *H01L 2933/0091* (2013.01)

(58) Field of Classification Search
  CPC ....... H01L 33/505; H01L 33/56; H01L 33/60; H01L 2933/0091
  See application file for complete search history.

(56) References Cited

U.S. PATENT DOCUMENTS

| | | |
|---|---|---|
| 8,957,428 B2 | 2/2015 | Jagt et al. |
| 9,024,340 B2 | 5/2015 | Minato et al. |
| 9,825,001 B2 | 11/2017 | Tamaki et al. |
| 10,290,607 B2 | 5/2019 | Tamaki et al. |
| 10,636,764 B2 | 4/2020 | Tamaki et al. |
| 2010/0059782 A1* | 3/2010 | Fujitomo .......... H01L 31/02002 257/98 |

(Continued)

FOREIGN PATENT DOCUMENTS

| | | |
|---|---|---|
| JP | 2010206039 A | 9/2010 |
| JP | 2010219324 A | 9/2010 |

(Continued)

OTHER PUBLICATIONS

Japanese Office Action dated Sep. 15, 2020 issued in Japanese Application No. 2016-218246.

(Continued)

*Primary Examiner* — Timor Karimy
(74) *Attorney, Agent, or Firm* — Holtz, Holtz & Volek PC

(57) ABSTRACT

To improve light emission efficiency and suppress color unevenness on a light emitting surface. Provided is a semiconductor light emitting device including a light emitting element, a wavelength conversion layer for converting light emitted from the light emitting element to light having a predetermined wavelength, a light reflection member covering at least the side surfaces of the wavelength conversion layer, and a thin film provided on the outermost surface from which the light wavelength-converted by the wavelength conversion layer exits, having a property for shedding the uncured light reflection member, and having a coarse surface.

17 Claims, 9 Drawing Sheets

(56) References Cited

U.S. PATENT DOCUMENTS

| | | | | |
|---|---|---|---|---|
| 2011/0235355 A1* | 9/2011 | Seko | ....................... | H01L 33/50 |
| | | | | 362/510 |
| 2012/0235169 A1* | 9/2012 | Seko | ....................... | H01L 33/60 |
| | | | | 257/88 |
| 2013/0121009 A1* | 5/2013 | Tsutsumi | ................ | H01L 33/44 |
| | | | | 362/510 |
| 2015/0001563 A1* | 1/2015 | Miki | ....................... | H01L 33/54 |
| | | | | 257/98 |
| 2015/0287896 A1 | 10/2015 | Minato et al. | | |
| 2017/0084587 A1* | 3/2017 | Hung | .................... | H01L 33/508 |

FOREIGN PATENT DOCUMENTS

| | | | |
|---|---|---|---|
| JP | 2012503876 | A | 2/2012 |
| JP | 2012079840 | A | 4/2012 |
| JP | 2014067876 | A | 4/2014 |
| JP | 5526782 | B2 | 6/2014 |
| JP | 2014130963 | A | 7/2014 |
| JP | 2015076456 | A | 4/2015 |
| JP | 2016072471 | A | 5/2016 |
| KR | 20120050286 | A | 5/2012 |

OTHER PUBLICATIONS

Japanese Office Action dated Sep. 15, 2020 issued in Japanese Application No. 2016-218250.

* cited by examiner

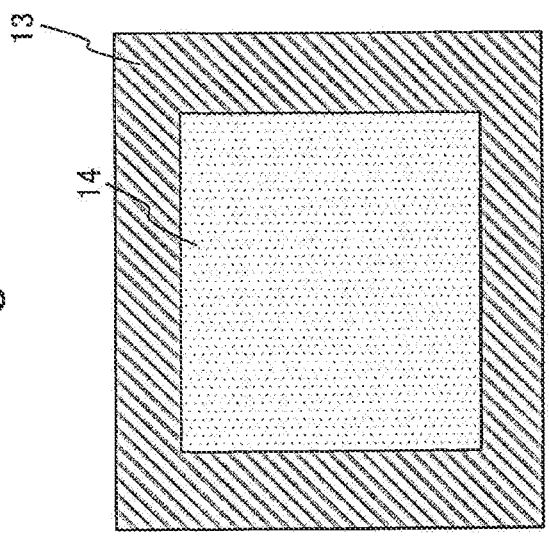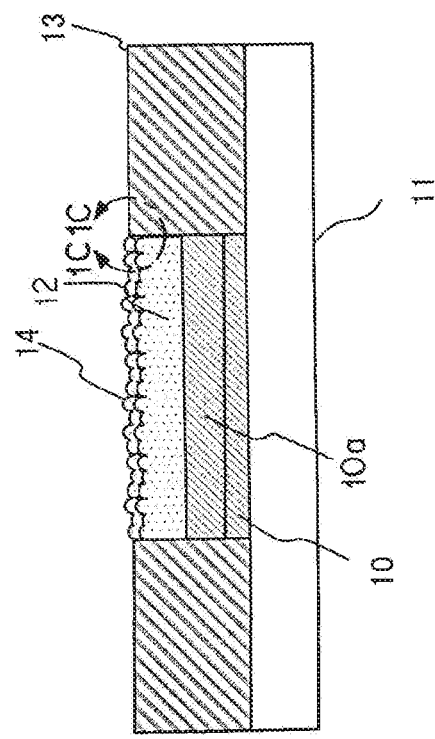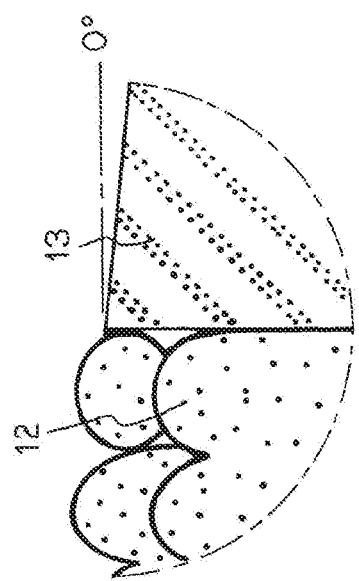

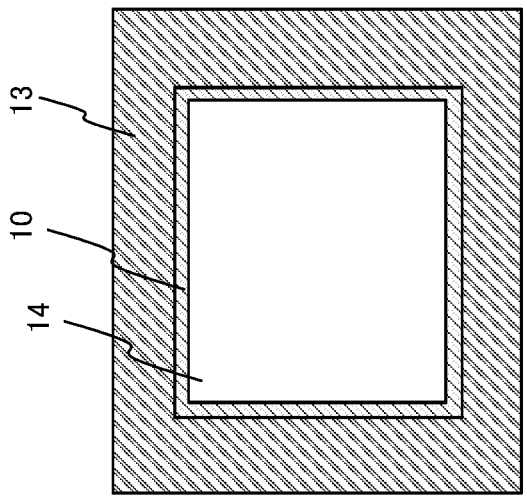
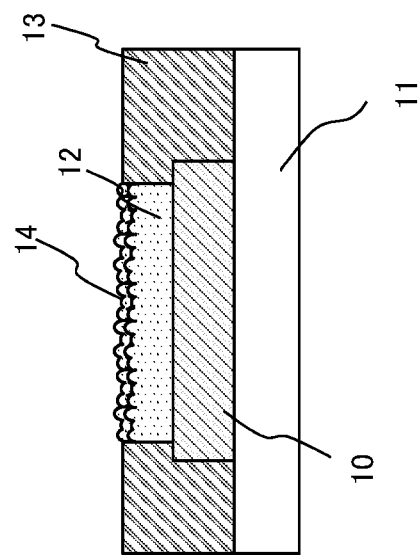

SEMICONDUCTOR LIGHT EMITTING DEVICE

BACKGROUND OF THE INVENTION

1. Field of the Invention

The present invention relates to a semiconductor light emitting device that converts light from a light emitting element to light having a desired wavelength using a wavelength conversion member.

2. Description of the Related Art

There are known semiconductor light emitting devices that wavelength-convert light from a semiconductor light emitting element using a wavelength conversion member and emit white light. Such semiconductor light emitting devices are used as the light sources of light fixtures such as general luminaires, street lighting fixtures, and vehicular lighting fixtures. In particular, vehicular lighting fixtures need to have high front brightness, so various types of semiconductor light emitting devices have been proposed.

For example, Japanese Patent No. 5526782 discloses a light emitting device that includes a light emitting element, a light transmission member having a light emitting surface exposed externally and side surfaces continued from the light emitting surface and capable of wavelength-converting light from the light emitting element, and a covering member including a light reflection material covering the side surfaces of the light transmission member and the side surfaces of the light emitting element so as to surround these surfaces, in which the front brightness is improved by using substantially only the light emitting surface of the upper surface as the light release region of the light emitting device.

SUMMARY OF THE INVENTION

By the way, since the surface layer of the light emitting surface is flat and made of an inorganic material in the light transmission member applied to the semiconductor light emitting device disclosed in Japanese Patent No. 5526782 described above or the like, light emitted from the light emitting element is reflected by the surface layer of the light emitting surface and cannot exit externally from the light emitting surface, thereby reducing the light emission efficiency. In contrast, to solve this problem, there is proposed a semiconductor light emitting device in which the surface layer of the light emitting surface is a coarse surface, that is, concavity and convexity are formed on the surface layer of the light emitting surface. However, if the surface layer of the light emitting surface is coarse, a covering member including a light reflection material climbs up on the light emitting surface when the covering member is applied in the manufacturing process of the semiconductor light emitting device. In particular, when resin is used as the covering member, capillary phenomenon occurs on the coarse surface of the surface layer of the light emitting surface and resin easily wet-spreads on the coarse surface. In addition, when corners of the surface layer of the light emitting surface are rounded, the resin is not easily stemmed due to reduction in the surface tension and the resin easily wet-spreads on the surface layer of the light emitting surface. Since the resin climbs up and wet-spreads on the surface layer of the light emitting surface as described above, the surface area of the light emitting surface is reduced and the light emission efficiency may be reduced.

In addition, some of materials used for a semiconductor light emitting device such as the semiconductor light emitting device disclosed in Japanese Patent No. 552682 described above are generally apt to degrade due to effects of humidity. For example, in some fluorescent materials, the long-term reliability is reduced and the light emission efficiency is reduced over time by effects of humidity.

In addition, since the tolerance of the covering member is reduced at high temperature and high humidity, if the covering member is used at high temperature and high humidity for a long period of time, a crack may be generated near the boundary between the covering member and the wavelength conversion member. If a crack is generated in the covering member, light leakage occurs and light wavelength-converted by the wavelength conversion member leaks from the crack because the crack is close to the wavelength conversion member.

The invention addresses the above situations with the first object of improving light emission efficiency by preventing the covering member such as a light reflection material from climbing up on the surface layer of the light emitting surface. In addition, the second object is to improve long-term reliability by suppressing the transmission of damp air through the thin film, the generation of a crack in the covering member such as a light reflection material, and light leakage.

According to an aspect of the invention, there is provided a semiconductor light emitting device including a light emitting element, a wavelength conversion layer for converting light emitted from the light emitting element to light having a predetermined wavelength, a light reflection member covering at least side surfaces of the wavelength conversion layer, and a thin film provided on an outermost surface from which the light wavelength-converted by the wavelength conversion layer exits and having a property for shedding the uncured light reflection member.

According to another aspect of the invention, there is provided a semiconductor light emitting device including a light emitting element, a wavelength conversion layer for converting light emitted from the light emitting element to light having a predetermined wavelength, a light transmission substrate through which the light wavelength-converted by the wavelength conversion layer transmits, a light reflection member covering at least side surfaces of the light transmission substrate, and a thin film provided on an outermost surface of the light transmission substrate from which the light wavelength-converted by the wavelength conversion layer exits and having a property for shedding the uncured light reflection member.

In the above aspects, preferably, the surface of the thin film is coarse, a contact angle of the thin film with respect to the uncured light reflection material is larger than contact angles of the wavelength conversion layer and the light transmission substrate with respect to the uncured light reflection member, the thin film is made of fluororesin, and the thin film has a thickness from 1 nm to 10 μm, more preferably from 50 nm to 1 μm. In addition, the thin film has a contact angle of 40 degrees or more.

According to an aspect of the invention, there is provided a semiconductor light emitting device including a light emitting element, a wavelength conversion layer for converting light emitted from the light emitting element to light having a predetermined wavelength, a light reflection member covering at least side surfaces of the wavelength conversion layer, and a thin film provided on an outermost surface from which the light wavelength-converted by the wavelength conversion layer exits, the thin film being a damp-proof film provided so as to cover a predetermined range including at least a boundary between the wavelength conversion layer and the light reflection member.

According to another aspect of the invention, there is provided a semiconductor light emitting device including a light emitting element, a wavelength conversion layer for converting light emitted from the light emitting element to light having a predetermined wavelength, a light transmission substrate through which the light wavelength-converted by the wavelength conversion layer transmits, a light reflection member covering at least side surfaces of the light transmission substrate, and a thin film provided on an outermost surface from which the light wavelength-converted by the wavelength conversion layer exits, the thin film being a damp-proof film provided so as to cover a predetermined range including at least a boundary between the light transmission substrate and the light reflection member.

In the above aspects, preferably, the thin film is made of fluororesin and the thin film has a thickness from 1 nm to 10 µm, more preferably from 50 nm to 1 µm.

According to the invention, it is possible to prevent the covering member such as a light reflection material from climbing up on the surface layer of the light emitting surface, improve the light emission efficiency, suppress the generation of a crack in the covering member such as a light reflection material, thereby suppressing light leakage.

BRIEF DESCRIPTION OF THE DRAWINGS

FIGS. 1A, 1B and 1C illustrate the schematic structure of a semiconductor light emitting device according to a first embodiment of the invention, FIG. 1A is a cross sectional view, FIG. 1B is a plan view, and FIG. 1C is an enlarged view of area 1C-1C in FIG. 1A.

FIGS. 2A and 2B illustrate the schematic structure of a semiconductor light emitting device according to another example of the first embodiment of the invention, FIG. 2A is a cross sectional view, and FIG. 2B is a plan view.

FIG. 3A is a cross sectional view, and FIG. 3B is a plan view.

FIG. 8A illustrates an example when the light emitting element is larger than the wavelength conversion layer, and FIG. 8B illustrates an example when the wavelength conversion layer is larger than the light emitting element.

FIG. 10A is a plan view, and FIG. 10B is a cross sectional view taken along line A-A in FIG. 10A.

DESCRIPTION OF THE PREFERRED EMBODIMENTS

Figure 3B:
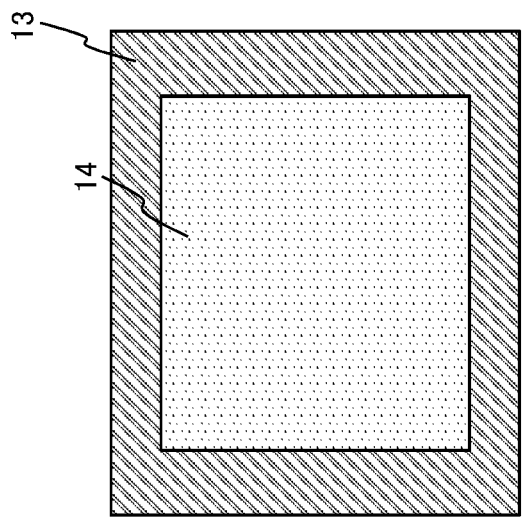
FIGS. 3A and 3B illustrate the schematic structure of a semiconductor light emitting device according to another example of the first embodiment of the invention.

Embodiments of the invention will be described below with reference to the drawings. It should be noted that hatching is omitted as appropriate even in a cross sectional view to make understanding easy and improve visibility in the drawings illustrated below. In addition, in a plan view of the semiconductor light emitting device, the part that cannot be visually recognized in plan view is indicated by a dashed line and hatching or the like is used for the purpose of description. In addition, in the following description, the same components are given the same reference numerals even in different embodiments or modifications to omit descriptions.

First Embodiment

The semiconductor light emitting device according to the first embodiment of the invention will be described.

The semiconductor light emitting device according to the embodiment includes a light emitting element 10, a wavelength conversion layer 12 for converting light emitted from the light emitting element to light having a predetermined wavelength, a light reflection member covering at least the side surfaces of the wavelength conversion layer, and a thin film provided on the outermost surface from which the light wavelength-converted by the wavelength conversion layer exits, having a coarse surface, and having a contact angle larger than the wavelength conversion layer.

More specifically, FIG. 1A is a cross sectional view illustrating a semiconductor light emitting device 1, FIG. 1B is a plan view illustrating the semiconductor light emitting device 1. FIG. 1C is an enlarged view of area 1C-1C in FIG. 1A. As illustrated in FIGS. 1A and 1B, the semiconductor light emitting device 1 includes the light emitting element 10, a mount substrate 11 on which the light emitting element 10 is mounted, the wavelength conversion layer 12, a light reflection member 13, a thin film 14.

The light emitting element 10 is rectangular in plan view and has a flip chip structure obtained by reversing the structure in which a semiconductor layer and a light emitting layer 10a are laminated and a power supply electrode is formed on a substrate which is transparent for light to be emitted. The light emitting element 10 emits light emitted from the light emitting layer 10a to the outside. Accordingly, the light emitting surfaces of the light emitting element 10 are the upper surface and the side surfaces. It should be noted that the electrode of the light emitting element 10 is conducted to the wiring pattern on the mount substrate 11 via a bump (not illustrated) or the like.

In the embodiment, the mount substrate 11 is a plate body made of a ceramic material and a plate substrate made of aluminum nitride is used. It should be noted that the substrate is generally made of an insulating material such as glass epoxy, resin, or ceramic or a composite material including an insulating material and a metal member. The substrate is preferably made of ceramic or resin having high heat resistance and high weather resistance.

It should be noted that a wiring pattern (not illustrated) is formed on the mount substrate 11. The wiring pattern is formed on the surface of the mount substrate 11 as the mount pattern of the light emitting element 10 and the current routing pattern for supplying the power source to the light emitting element 10. A conductive material such as Al, Ni, Cu, Ag, or Au is used as the wiring pattern.

The wavelength conversion layer 12 includes a fluorescent material converting light emitted from the light emitting element 10 to light having a predetermined wavelength and is provided on the upper surface of the light emitting element 10. More specifically, the wavelength conversion layer 12 may be made of, for example, a mixture or of sintered body of ceramic and a fluorescent material, a mixture of glass and a fluorescent material, ceramic on which a fluorescent material film is disposed, glass on which a fluorescent material film is formed, fluorescent material dispersion glass, or a fluorescent material ceramic plate. In the embodiment, the wavelength conversion layer 12 has substantially the same size as the light emitting surface on the upper surface of the light emitting element 10 and the upper surface is a coarse surface. Preferably, the wavelength conversion layer has a thickness of, for example, approximately 10 µm to 500 µm, more particularly approximately 30 µm to 250 µm.

The light reflection member 13 is provided so as to cover the side surfaces of the wavelength conversion layer 12 and expose the upper surface of the wavelength conversion layer 12 to the outside. As the light reflection member 13, a mixture in which a predetermined amount of a light reflection filler (such as, for example, titanium oxide, alumina, zirconia, or zinc oxide) has been mixed with, for example, silicone resin can be used.

The thin film 14 is provided on the outermost surface of the semiconductor light emitting device. In the embodiment, the thin film 14 is provided on the coarse surface on the upper surface of the wavelength conversion layer 12 so as to have a uniform film thickness. Accordingly, the surface of the thin film 14 is a coarse surface. In addition, as the thin film 14, a material having a contact angle (with respect to the uncured light reflection member) larger than in the wavelength conversion layer 12 is selected. More specifically, a material that sheds the uncured light reflection member 13 in the liquid state is used as the thin film 14. In addition, the contact angle of the thin film 14 with respect to water is preferably 40 degrees or more. For example, by using a material having good nonadherence and good slipperiness such as fluororesin, the contact angle with respect to water can be maintained at 40 degrees or more. Other than this, organic matter such as organo-epoxy can be used as the thin film 14.

In addition, the thin film has a film thickness of preferably 1 nm to 10 µm, more preferably 50 nm to 1 µm, still more preferably 50 nm to 100 nm. Since the upper surface of the wavelength conversion layer 12 is a coarse surface in the embodiment, by providing the thin film 14 on the wavelength conversion layer 12 so as to have a uniform film thickness, the thin film 14 follows the concavity and convexity on the wavelength conversion layer 12 and the upper surface of the thin film 14 becomes a coarse surface on which the concavity and convexity remain. It should be noted that the thin film 14 is preferably formed in advance on the upper surface of the wavelength conversion layer 12 using, for example, a spin coater or spray.

The semiconductor light emitting device configured as described above is manufactured as described below.

Before the semiconductor light emitting device is manufactured, the thin film 14 made of fluororesin is formed in advance on a fluorescent material ceramic plate that becomes the wavelength conversion layer 12. It should be noted that the concentration and thickness of a fluorescent material is adjusted in advance and the fluorescent material ceramic plate is cut into a desired size after the thin film 14 is formed thereon. In the embodiment, the fluorescent material ceramic plate that becomes the wavelength conversion layer 12 is cut into substantially the same size as the upper surface of the light emitting element 10.

Then, the light emitting element 10 is mounted via a bump (not illustrated) on the mount substrate 11 on which a wiring pattern (not illustrated) has been formed in advance. Next, the fluorescent material ceramic plate on which the thin film 14 has been formed in advance and which has been cut into substantially the same size as the upper surface of the light emitting element 10 is mounted on the upper surface of the light emitting element 10 with resin for fluorescent material ceramic plate adhesion applied therebetween and the resin is heated and cured to form the wavelength conversion layer 12 and the thin film 14.

Next, a light reflection member in which a predetermined amount of a light reflection filler has been mixed with uncured silicone resin in advance is poured onto the mount substrate 11 until the side surfaces of the light emitting element 10 and the wavelength conversion layer 12 are fully surrounded. At this time, as shown in FIG. 1C, the height of the poured light reflection member 13 is maximized in the boundary part between the wavelength conversion layer 12 and the light reflection member 13 and is gradually reduced with distance from the wavelength conversion layer 12. When the semiconductor light emitting device has a cavity, the height increases from the low part to the upper surface of the cavity. When the upper surface of the cavity is higher than the wavelength conversion layer, the height of the light reflection member 13 is maximized in the connection portion in the cavity and the connection portion.

As described above, the light reflection member 13 attempts to climb up on the wavelength conversion layer 12 and wet-spread on the coarse surface of the wavelength conversion layer 12 due to capillary phenomenon. However, since the thin film 14 shedding the uncured light reflection member 13 is formed on the upper surface of the wavelength conversion layer 12, the light reflection member 13 is prevented from climbing up and wet-spreading on the wavelength conversion layer 12. By curing the light reflection member 13 via an appropriate curing method such as heating or irradiation with ultraviolet rays in this state and performing a dicing cut into a predetermined size, it is possible to manufacture singularized semiconductor light emitting devices so that the side surfaces of the wavelength conversion layer 12 are covered with the light reflection member 13.

Since the light reflection member 13 is prevented from climbing up and wet-spreading on the wavelength conversion layer 12, it is possible to maintain the shape of the coarse surface on the upper surface of the wavelength conversion layer 12 and suppress reduction in the light emission efficiency and the brightness caused by climbing up of the light reflection member.

In the embodiment, an example in which the wavelength conversion layer 12 has substantially the same size as the upper surface of the light emitting element 10 has been described. However, the wavelength conversion layer 12 may be smaller than the upper surface of the light emitting element 10 as illustrated in, for example, FIGS. 2A and 2B.

Figure 3A:
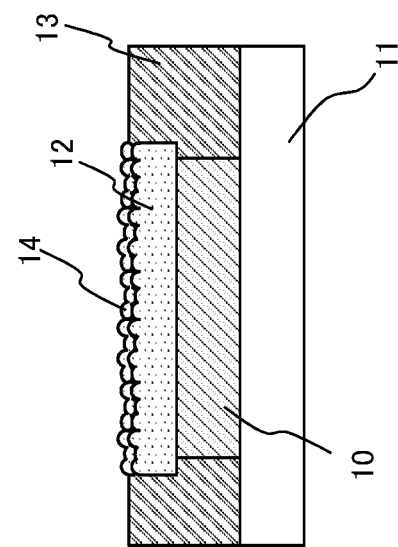

In addition, the wavelength conversion layer 12 may be larger than the upper surface of the light emitting element 10 as illustrated in FIGS. 3A and 3B.

In addition, when the surface of the wavelength conversion layer 12 is a flat surface instead of a coarse surface, it is possible to prevent the light reflection member from climbing up and wet-spreading on the wavelength conversion layer 12 as well and prevent reduction in the light emission efficiency and the brightness by making the surface of the thin film 14 coarse.

When the thin film 14 is formed on the upper surface of the wavelength conversion layer 12, concavity and convexity may be reduced slightly because the thin film 14 is thick in a concave portion on the coarse surface and thin in a convex portion. However, even in this case, the coarse surface does not become completely flat and concavity and convexity on the coarse surface can be maintained, so the light emission efficiency can be maintained.

Second Embodiment

Figure 4:
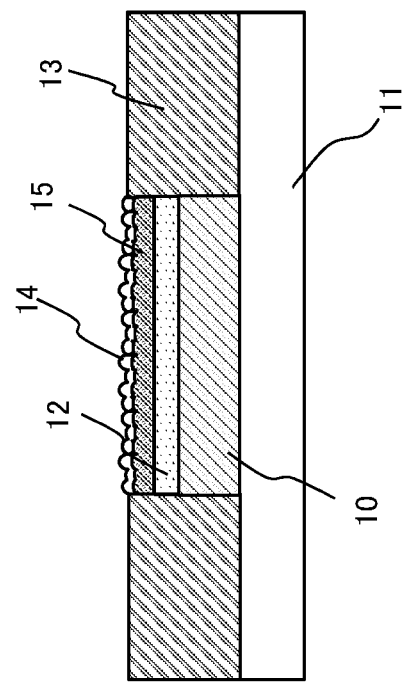
FIG. 4 is a cross sectional view illustrating the schematic structure of a semiconductor light emitting device according to a second embodiment of the invention.

Next, the semiconductor light emitting device according to the second embodiment of the invention will be described. In the first embodiment of the invention described above, an example in which the thin film is formed on the upper surface of the wavelength conversion layer 12 has been described. In the second embodiment, an example in which the semiconductor light emitting device has a light transmission substrate and the thin film 14 is formed on the light transmission substrate will be described. FIG. 4 is a cross sectional view illustrating the semiconductor light emitting device according to the embodiment. In the following description, the same components as in the first embodiment described above are given the same reference numerals to omit descriptions.

The semiconductor light emitting device according to the embodiment includes the light emitting element 10, the wavelength conversion layer 12 for converting light emitted from the light emitting element 10 to light having a predetermined wavelength, a light transmission substrate 15 through which the light wavelength-converted by the wavelength conversion layer 12 transmits, the light reflection member 13 covering at least the side surfaces of the light transmission substrate 15, and the thin film provided on the outermost surface from which the light wavelength-converted by the wavelength conversion layer 12 exits, having a coarse surface, and having a contact angle larger than the wavelength conversion layer 15.

The light transmission substrate 15 is made of, for example, glass, sapphire, silicone resin, or the like and, in the embodiment, has substantially the same area as the wavelength conversion layer 12 and is disposed on the upper surface of the wavelength conversion layer 12.

The thin film 14 is provided on the outermost surface of the semiconductor light emitting device as in the first embodiment described above. Accordingly, in the embodiment, the thin film 14 is provided on the upper surface of the light transmission substrate 15 and provided on the coarse surface on the upper surface of the light transmission substrate 15 so as to have a uniform film thickness. Accordingly, the surface of the thin film 14 is a coarse surface. In addition, a material having a larger contact angle with respect to the uncured light reflection member than the light transmission substrate 15 is selected and used as the thin film 14. More specifically, a material that sheds the uncured light reflection member 13 in the liquid state and has a contact angle with respect to water of 40 degrees or more is used as the thin film 14. The contact angle with respect to water can be maintained at 40 degrees or more by using, for example, a material having good nonadherence and good slipperiness such as fluororesin.

In addition, the thin film has a film thickness of preferably 1 nm to 10 μm, more preferably 50 nm to 1 μm. Since the upper surface of the light transmission substrate 15 is a coarse surface in the embodiment, by providing the thin film 14 on the light transmission substrate 15 so as to have a uniform film thickness, the thin film 14 follows the concavity and convexity on the light transmission substrate 15 and the upper surface of the thin film 14 becomes a coarse surface on which the concavity and convexity remain. It should be noted that the thin film 14 is preferably formed in advance on the upper surface of the light transmission substrate 15 using, for example, a spin coater or spray.

The semiconductor light emitting device configured as described above is manufactured as described below.

Before the semiconductor light emitting device is manufactured, the thin film 14 made of fluororesin is formed in advance on a plate member of glass or the like that becomes the light transmission substrate 15. It should be noted that the light transmission substrate 15 is cut into a desired size after the thin film 14 is formed thereon. In the embodiment, the light transmission substrate 15 is cut into substantially the same size as the upper surfaces of the light emitting element 10 and the wavelength conversion layer 12.

Then, the light emitting element 10 is mounted via a bump (not illustrated) on the mount substrate 11 on which a wiring pattern (not illustrated) has been formed in advance. Next, the fluorescent material ceramic plate is mounted on the upper surface of the light emitting element 10 with resin for fluorescent material ceramic plate adhesion applied therebetween and then resin for fluorescent material ceramic plate adhesion is applied to form the wavelength conversion layer 12. Next, the light transmission substrate 15 on which the thin film 14 has been formed is mounted on the upper surface of the wavelength conversion layer 12 and the light transmission substrate 15 is fixed.

Next, a light reflection member in which a predetermined amount of a light reflection filler has been mixed with silicone resin in advance is poured onto the mount substrate 11 until the side surfaces of the light emitting element 10 and the light transmission substrate 15 are fully surrounded. At this time, the height of the poured light reflection member 13 is maximized in the boundary part between the light transmission substrate 15 and the light reflection member 13 and is gradually reduced with distance from the light transmission substrate 15.

The light reflection member 13 attempts to climb up on the light transmission substrate 15 and wet-spread on the coarse surface of the light transmission substrate 15 due to capillary phenomenon. However, since the thin film 14 shedding the light reflection member is formed on the upper surface of the light transmission substrate 15, the light reflection member 13 is prevented from climbing up and wet-spreading on the wavelength conversion layer 12. By heating and curing the light reflection member 13 in this state and performing a dicing cut into a predetermined size, it is possible to manufacture singularized semiconductor light emitting devices so that the side surfaces of the light transmission substrate 15 are covered with the light reflection member 13.

Since the light reflection member 13 is prevented from climbing up and wet-spreading on the light transmission substrate 15, it is possible to suppress reduction in the light emission efficiency and the brightness caused by climbing up of the light reflection member.

Figure 5:
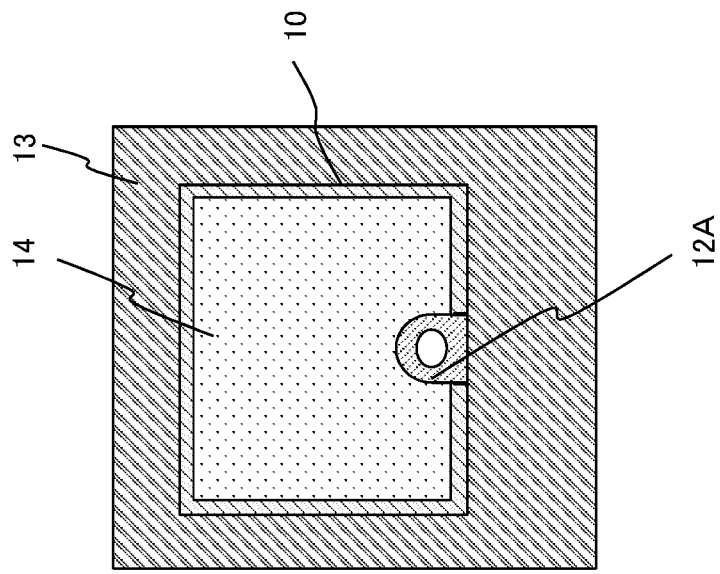
FIG. 5 is a plan view illustrating the schematic structure of the semiconductor light emitting device according to the first embodiment of the invention when a wire bonding type light emitting element is applied.

It should be noted that FIG. 5 illustrates an example in which a wire bonding type light emitting element that supplies power via a bonding wire connected to the upper surface of the light emitting element is used. In FIG. 5, the wavelength conversion layer 12 is disposed on the upper surface (that is, the light emitting surface) of the light emitting element 10. Since a wire is disposed on the upper surface of the light emitting element 10 in this example, a notch 12A for escaping the wire is formed in the wavelength conversion layer 12. Although the notch is provided in the middle of any one of the edges of the wavelength conversion layer 12 in the drawing, the notch may be provided at the center, at a corner, or in an edge of the element arbitrarily. In addition, the number of wires may be determined to be one or two or more as appropriate.

The semiconductor light emitting devices according to the embodiments described above are applicable to the light sources of head lamps or ADB (Adaptive Driving Beam) type vehicular lighting fixtures as well as general lighting fixtures for illumination or other purposes.

The height of the light reflection member 13 tends to reduce with distance from the wavelength conversion layer 12 or the light transmission substrate 15 and, if this tendency becomes strong, light leakage from the side surfaces of the wavelength conversion layer 12 or the light transmission substrate 15 increases, causing a glare problem when the semiconductor light emitting device is applied to, for example, a vehicular lighting fixture. Since the height of the light reflection member 13 can be increased by providing the thin film 14 in the embodiments described above, the light reflection member 13 can be formed in a shape widened substantially flatly with respect to the wavelength conversion layer 12 or the light transmission substrate 15. This can avoid the glare problem during application to a vehicular head lamp.

Third Embodiment

Next, the semiconductor light emitting device according to the third embodiment of the invention will be described.

The semiconductor light emitting device according to the embodiment includes the light emitting element 10, the wavelength conversion layer. 12 for converting light emitted from the light emitting element to light having a predetermined wavelength, the light reflection member 13 covering at least the side surfaces of the wavelength conversion layer 12, and the thin film 14 provided on the outermost surface from which the light wavelength-converted by the wavelength conversion layer 12 exits, the thin film 14 being a damp-proof film provided so as to cover a predetermined range including at least the boundary between the wavelength conversion layer 12 and the light reflection member 13.

Figure 6:
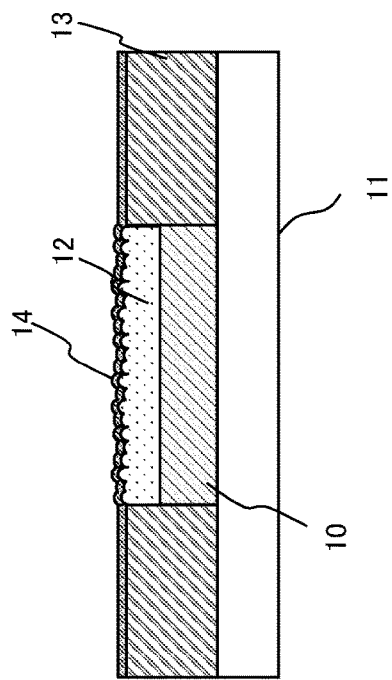
FIG. 6 is a cross sectional view illustrating the schematic structure of a semiconductor light emitting device according to a third embodiment of the invention.

More specifically, FIG. 6 is a cross sectional view illustrating the semiconductor light emitting device 1 and, as illustrated in FIG. 6, the semiconductor light emitting device 1 includes the light emitting element 10, the mount substrate 11 on which the light emitting element 10 is mounted, the wavelength conversion layer 12, the light reflection member 13, and the thin film 14.

The light emitting element 10 is rectangular in plan view and has a flip chip structure obtained by reversing the structure in which a semiconductor layer and a light emitting layer are laminated and a power supply electrode is formed on a substrate which is transparent for light to be emitted. The light emitting element 10 emits light emitted from the light emitting layer to the outside. Accordingly, the light emitting surfaces of the light emitting element 10 are the upper surface and the side surfaces. It should be noted that the electrode of the light emitting element 10 is conducted to the wiring pattern on the mount substrate 11 via a bump (not illustrated) or the like.

In the embodiment, the mount substrate 11 is a plate body made of a ceramic material and a plate substrate made of aluminum nitride is used. It should be noted that the substrate is generally made of an insulating material such as glass epoxy, resin, or ceramic or a composite material including an insulating material and a metal member. The substrate is preferably made of ceramic or resin having high heat resistance and high weather resistance.

It should be noted that a wiring pattern (not illustrated) is formed on the mount substrate 11. The wiring pattern is formed on the surface of the mount substrate 11 as the mount pattern of the light emitting element 10 and the current routing pattern for supplying the power source to the light emitting element 10. A conductive material such as Al, Ni, Cu, Ag, or Au is used as the wiring pattern.

The wavelength conversion layer 12 includes fluorescent material converting light emitted from the light emitting element 10 to light having a predetermined wavelength and is provided on the upper surface of the light emitting element 10. More specifically, the wavelength conversion layer 12 may be made of, for example, a mixture or of sintered body of ceramic and a fluorescent material, a mixture of glass and a fluorescent material, ceramic on which a fluorescent material film is disposed, glass on which a fluorescent material film is formed, fluorescent material dispersion glass, or a fluorescent material ceramic plate. In the embodiment, the wavelength conversion layer 12 has substantially the same size as the light emitting surface on the upper surface of the light emitting element 10 and the upper surface is a coarse surface. Preferably, the wavelength conversion layer has a thickness of, for example, approximately 10 μm to 500 μm, more particularly approximately 30 μm to 250 μm.

The light reflection member 13 is provided so as to cover the side surfaces of the wavelength conversion layer 12 and expose the upper surface of the wavelength conversion layer 12 to the outside. As the light reflection member 13, a mixture in which a predetermined amount of a light reflection filler (such as, for example, titanium oxide, alumina, zirconia, or zinc oxide) has been mixed with, for example, silicone resin can be used.

The thin film 14 is provided on the outermost surface of the semiconductor light emitting device. In the embodiment, the thin film 14 is provided in a predetermined range including the boundary between the wavelength conversion layer 12 and the light reflection member 13 and on the entire upper surface of the wavelength conversion layer 12 so as to have a uniform thickness on the coarse surface on the upper surface of the wavelength conversion layer 12. Accordingly, the upper face of the thin film 14 is a coarse surface. In addition, the thin film 14 is preferably made of a damp-proof material such as, for example, fluororesin. The thin film 14 becomes a coarse surface on the upper surface of the wavelength conversion layer 12 by following the coarse surface of the wavelength conversion layer 12 and becomes a smooth surface on the upper surface of the light reflection member 13 by following the smooth surface of the light reflection member 13.

Since such a damp-proof thin film is provided, moisture is prevented from entering the semiconductor light emitting device to suppress degradation and the generation of a crack in the light reflection member 13. In addition, even when a force is applied so as to separate the light reflection member 13 from the wavelength conversion layer 12 due to the thermal expansion of the light reflection member 13 and the wavelength conversion layer 12, since elasticity of the thin film 14 causes a tensile stress in the horizontal direction on the surface of semiconductor light emitting device, the force is suppressed and the separation of the light reflection member 13 from the wavelength conversion layer 12 is suppressed.

It should be noted that, for example, fluororesin can be used as the thin film 14. In this case, when the wavelength conversion layer 12, the light reflection member 13, and the thin film 14 are compared with each other, the thermal expansion coefficient of the wavelength conversion layer 12 is 8.6 ppm, the thermal expansion coefficient of the light reflection member 13 is 300 ppm, and the thermal expansion coefficient of the thin film 14 is 74 ppm. In addition, the tensile elastic modulus of the wavelength conversion layer 12 is 363 GPa, the tensile elastic modulus of the light reflection member 13 is 0.0046 GPa, and the tensile elastic modulus of the thin film 14 is 1.5 GPa. In addition, the water vapor transmission coefficient per hour of the thin film 14 is 0.2 g/m$^2$.

Figure 7:
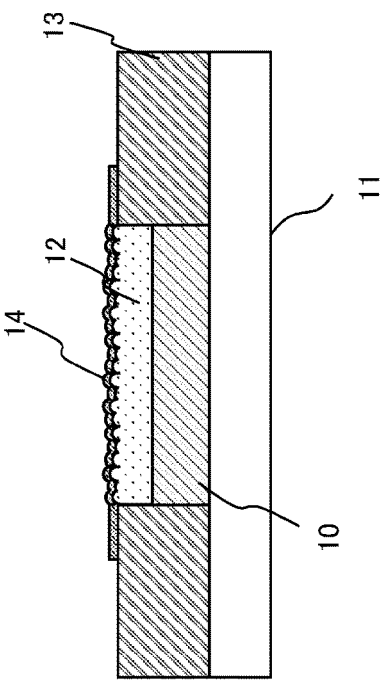
FIG. 7 is a cross sectional view illustrating the schematic structure of a semiconductor light emitting device according to another example of the third embodiment of the invention.

Although the thin film 14 is provided on the entire outermost surface of the semiconductor light emitting device in the embodiment as illustrated in FIG. 6, the thin film 14 does not need to cover the entire surface and the thin film 14 only needs to cover the boundary between the wavelength conversion layer 12 and the light reflection member 13. For example, as illustrated in FIG. 7, the thin film 14 may be provided so as to cover the entire surface of the wavelength conversion layer 12, the boundary part between the wavelength conversion layer 12 and the light reflection member 13, and the predetermined range of the light reflection member 13. Since a crack in the light reflection member 13 is easily generated in an end surface such as the boundary part with respect to the wavelength conversion layer 12, degradation of the light reflection member 13 can be suppressed and generation of a crack in the light reflection member 13 can be suppressed by covering at least the boundary part between the wavelength conversion layer 12 and the light reflection member 13.

In addition, the thin film has a film thickness of preferably 1 nm to 10 μm, more preferably 50 nm to 1 μm, still more preferably 50 nm to 100 nm. Since the upper surface of the wavelength conversion layer 12 is a coarse surface in the embodiment, by providing the thin film 14 on the wavelength conversion layer 12 so as to have a uniform film thickness, the thin film 14 follows the concavity and convexity on the wavelength conversion layer 12 and the upper surface of the thin film 14 becomes a coarse surface on which the concavity and convexity remain. It should be noted that the thin film 14 is preferably formed using, for example, a spin coater or spray at the final stage of the manufacturing process of the semiconductor light emitting device.

The semiconductor light emitting device configured as described above is manufactured as described below.

Before the semiconductor light emitting device is manufactured, a fluorescent material ceramic plate for which the concentration and thickness has been adjusted and which has been cut into a desired size is prepared in advance as the wavelength conversion layer 12. In the embodiment, the fluorescent material ceramic plate that becomes the wavelength conversion layer 12 is cut into substantially the same size as the upper surface of the light emitting element 10.

Then, the light emitting element 10 is mounted on the mount substrate 11 on which a wiring pattern (not illustrated) has been formed in advance via a bump (not illustrated). Next, the fluorescent material ceramic plate having been cut into substantially the same size as the upper surface of the light emitting element 10 is mounted on the upper surface of the light emitting element 10 with resin for fluorescent material ceramic plate adhesion applied therebetween and then resin for fluorescent material ceramic plate adhesion is applied to form the wavelength conversion layer 12.

Next, the light reflection member in which predetermined amount of a light reflection filler has been mixed with uncured silicone resin in advance is poured onto the mount substrate 11 until the side surfaces of the light emitting element 10 and the wavelength conversion layer 12 are fully surrounded. At this time, the height of the poured light reflection member 13 is the same as the height of the wavelength conversion layer 12 or the height of the poured light reflection member 13 is maximized in the boundary part between the wavelength conversion layer 12 and the light reflection member 13 and is gradually reduced with distance from the wavelength conversion layer 12. In this state, the light reflection member 13 is cured by an appropriate curing method such as heating or irradiation with ultraviolet rays. By forming the thin film 14 on the entire surface and performing a dicing cut into a predetermined size after the light reflection member 13 is cured, singularized semiconductor light emitting devices can be manufactured so that the side surfaces of the wavelength conversion layer 12 are covered with the light reflection member 13 and the boundary part between the wavelength conversion layer 12 and the light reflection member 13 is covered with the thin film 14.

Since the thin film 14 is formed at least in the boundary part between the light reflection member 13 and the wavelength conversion layer 12 as described above, moisture is prevented from entering the semiconductor light emitting device. In addition, since the thin film 14 has airtightness, degradation due to vaporization of constituents included in the light reflection member 13 or the like can be suppressed and the generation of a crack in the light reflection member 13 can be suppressed. Accordingly light leakage is suppressed. In addition, even when a force is applied so as to separate the light reflection member 13 from the wavelength conversion layer 12 due to the thermal expansion of the light reflection member 13 and the wavelength conversion layer 12, since elasticity of the thin film 14 causes a tensile stress in the horizontal direction on the surface of semiconductor light emitting device, the force is suppressed and the generation of a crack in the light reflection member 13 is suppressed.

Figure 8A:
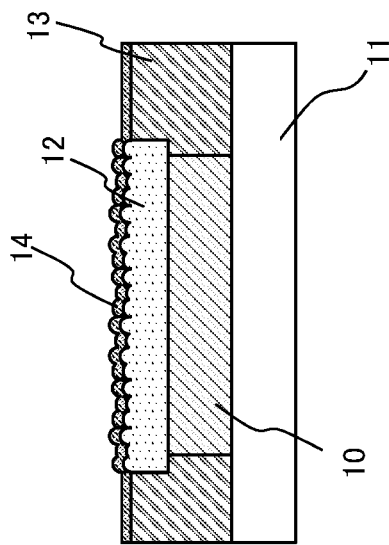
FIGS. 8A and 8B are cross sectional views illustrating the schematic structure of a semiconductor light emitting device according to another example of the third embodiment of the invention.
Figure 8B:
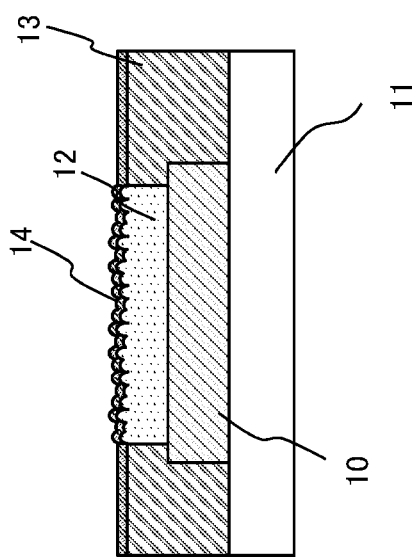

Although the wavelength conversion layer 12 has the same size as the upper surface of the light emitting element 10 in the embodiment, the wavelength conversion layer 12 may be smaller than the upper surface of the light emitting element 10 as illustrated in, for example, FIG. 8A. Alternatively, the wavelength conversion layer 12 may be larger than the upper surface of the light emitting element 10 as illustrated in FIG. 8B.

The surface tension of the wavelength conversion layer 12 suppresses the climbing up and wet-spreading of the light reflection member 13 on the wavelength conversion layer 12 and can suppress reduction in the light emission efficiency and the brightness. In addition, light leakage can be suppressed. In addition, when the surface of the wavelength conversion layer 12 is a flat surface, the climbing up and wet-spreading of the light reflection member 13 on the wavelength conversion layer 12 can be suppressed by making the surface of the thin film 14 coarse, thereby suppressing reduction in the light emission efficiency and the brightness. In addition, the light emission efficiency can be improved by suppressing light leakage.

When the thin film 14 is formed on the upper surface of the wavelength conversion layer 12, concavity and convexity may be reduced slightly because the thin film 14 is thick in a concave portion and thin in a convex portion on the coarse surface. However, even in this case, the coarse surface does not become completely flat and concavity and convexity on the coarse surface can be maintained, so the light emission efficiency can also be maintained.

Fourth Embodiment

Next, the semiconductor light emitting device according to the fourth embodiment of the invention will be described.

Figure 9:
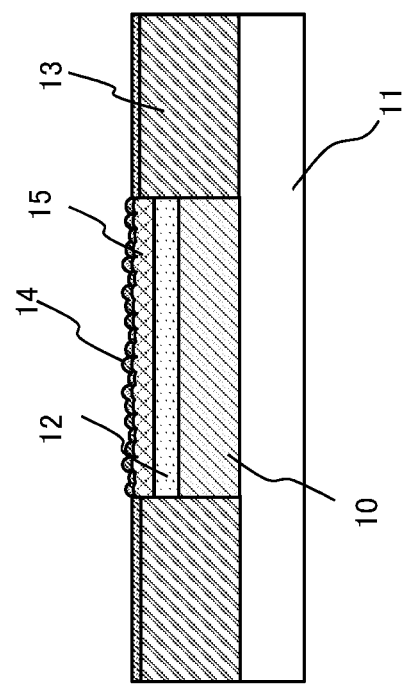
FIG. 9 is a cross sectional view illustrating the schematic structure of a semiconductor light emitting device according to a fourth embodiment of the invention.

In the third embodiment of the invention described above, an example in which the thin film is formed on the upper surface of the wavelength conversion layer 12 has been described. In the fourth embodiment, an example in which the semiconductor light emitting device has a light transmission substrate and the thin film 14 is formed on the upper surface of the light transmission substrate will be described. FIG. 9 is a cross sectional view illustrating the semiconductor light emitting device according to the embodiment. In the following description, the same components as in the first embodiment described above are given the same reference numerals to omit descriptions.

The semiconductor light emitting device according to the embodiment includes the light emitting element 10, the wavelength conversion layer 12 for converting light emitted from the light emitting element 10 to light having a predetermined wavelength, the light transmission substrate 15 through which the light wavelength-converted by the wavelength conversion layer 12 transmits, the light reflection member 13 covering at least the side surfaces of the light transmission substrate 15, and the thin film 14 provided on the outermost surface from which the light wavelength-converted by the wavelength conversion layer 12 exits, the thin film 14 being a damp-proof film provided so as to cover a predetermined range including at least the boundary between the light transmission substrate 15 and the light reflection member 13.

The light transmission substrate 15 is made of, for example, glass, sapphire, silicone resin, or the like and, in the embodiment, has a coarse surface, has substantially the same area as the wavelength conversion layer 12, and is disposed on the upper surface of the wavelength conversion layer 12.

The thin film 14 is provided on the outermost surface of the semiconductor light emitting device as in the first embodiment described above. Accordingly, in the embodiment, the thin film 14 is provided on the upper surface of the light transmission substrate 15 and provided on the coarse surface on the upper surface of the light transmission substrate 15 so as to have a uniform film thickness. Accordingly, the surface of the thin film 14 is a coarse surface. In addition, a damp-proof material such as, for example, fluororesin is preferably used as the thin film 14. Since such a damp-proof thin film is provided, moisture is prevented from entering the semiconductor light emitting device, degradation due to vaporization of constituents included in the light reflection member 13 or the like is suppressed, and the generation of a crack in the light reflection member 13 is suppressed. In addition, since elasticity of the thin film 14 causes a tensile stress in the horizontal direction on the surface of semiconductor light emitting device, thermal expansion of the light reflection member 13 and the light transmission substrate is suppressed and generation of a crack in the light reflection member 13 is suppressed.

The thin film 14 has a film thickness of preferably 1 nm to 10 µm, more preferably 50 nm to 1 µm. Since the upper surface of the light transmission substrate 15 is a coarse surface in the embodiment, by providing the thin film 14 on the light transmission substrate 15 so as to have a uniform film thickness, the thin film 14 follows the concavity and convexity on the light transmission substrate 15 and the upper surface of the thin film 14 becomes a coarse surface on which the concavity and convexity remain. It should be noted that the thin film 14 is preferably formed in advance on the upper surface of the light transmission substrate 15 using, for example, a spin coater or spray.

The semiconductor light emitting device configured as described above is manufactured as described below.

The plate member such as glass that becomes the light transmission substrate 15 is cut into the same size as the upper surfaces of the light emitting element 10 and the wavelength conversion layer 12 in advance. Next, the light emitting element 10 is mounted on the mount substrate 11 on which a wiring pattern (not illustrated) has been formed in advance via a bump (not illustrated). Next, the fluorescent material ceramic plate is mounted on the upper surface of the light emitting element 10 and heated and melted to form the wavelength conversion layer 12. Next, the light transmission substrate 15 on which the thin film 14 has been formed is mounted on the upper surface of the wavelength conversion layer 12 and fixed.

Next, the light reflection member in which a predetermined amount of a light reflection filler has been mixed with uncured silicone resin in advance is poured onto the mount substrate 11 until the side surfaces of the light emitting element 10 and the light transmission substrate 15 are fully surrounded. At this time, the height of the poured light reflection member 13 is maximized in the boundary part between the light transmission substrate 15 and the light reflection member 13 and is gradually reduced with distance from the light transmission substrate 15.

In this state, the light reflection member 13 is cured by an appropriate curing method such as heating or irradiation with ultraviolet rays. By forming the thin film 14 on the entire surface and performing a dicing cut into a predetermined size after the light reflection member 13 is cured, singularized semiconductor light emitting devices can be manufactured so that the side surfaces of the wavelength conversion layer 12 and the light transmission substrate 15 are covered with the light reflection member 13 and the boundary part between the light transmission substrate 15 and the light reflection member 13 is covered with the thin film 14.

Since the damp-proof thin film 14 provided in at least the boundary part between the light reflection member 13 and the light transmission substrate 15 as described above, moisture is prevented from entering the semiconductor light emitting device, degradation due to the vaporization of constituents contained in the light reflection member 13 or the like can be suppressed, and the generation of a crack in the light reflection member 13 can be suppressed. In addition, even when a force is applied so as to separate the light reflection member 13 from the wavelength conversion layer 12 due to the thermal expansion of the light reflection member 13 and the wavelength conversion layer 12, since elasticity of the thin film 14 causes a tensile stress in the horizontal direction on the surface of semiconductor light emitting device, the force is suppressed and the generation of a crack in the light reflection member 13 is suppressed. Accordingly, light leakage is suppressed and the light emission efficiency can be improved.

Figure 10B:
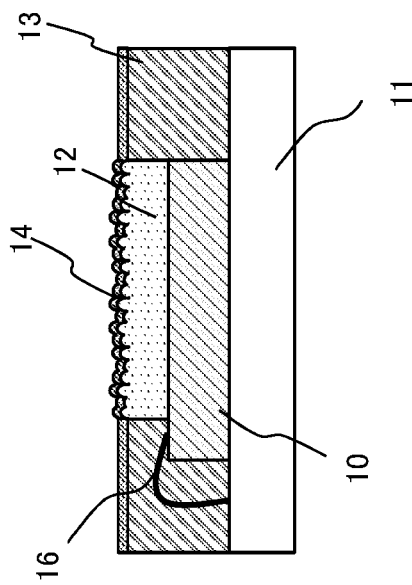
FIGS. 10A and 10B illustrate the schematic structure of a semiconductor light emitting device according to another example of the third embodiment of the invention.
Figure 10A:
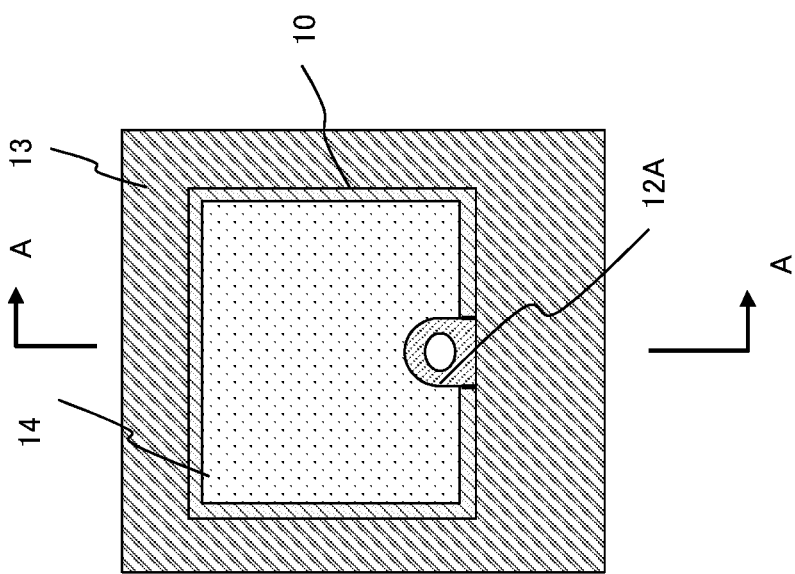

It should be noted that FIGS. 10A and 10B illustrate an example in which a wire bonding type light emitting element that supplies power via a bonding wire 16 connected to the upper surface of the light emitting element is used. In FIG. 10A, the wavelength conversion layer 12 is disposed on the upper surface (that is, the light emitting surface) of the light emitting element 10. It should be noted that the thin film 14 is not illustrated for convenience of description in FIG. 10A. Since the wire is disposed on the upper surface of the light emitting element 10 in the example illustrated in FIGS. 10A and 10B, the notch 12A for escaping the wire is formed in the wavelength conversion layer 12. Although the notch is provided in the middle of any one of the edges of the wavelength conversion layer 12 in FIG. 10A, the notch may be provided in the center, at a corner, or in an edge of the element arbitrarily. In addition, the number of wires may be determined to be one or two or more as appropriate.

The semiconductor light emitting devices according to the embodiments described above are applicable to the light sources of head lamps or ADB (Adaptive Driving Beam) type vehicular lighting fixtures as well as general lighting fixtures for illumination or other purposes.

The height of the light reflection member 13 tends to reduce with distance from the wavelength conversion layer 12 or the light transmission substrate 15 and, if this tendency becomes strong, light leakage from the side surfaces of the wavelength conversion layer 12 or the light transmission substrate 15 increases, causing a glare problem when the semiconductor light emitting device is applied to, for example, a vehicular lighting fixture. Since the height of the light reflection member 13 can be increased by providing the thin film 14 in the embodiments described above, the light reflection member 13 can be formed in a shape widened substantially flatly with respect to the wavelength conversion layer 12 or the light transmission substrate 15. This can avoid the glare problem during application to a vehicular head lamp.

What is claimed is:

1. A semiconductor light emitting device comprising:
    a mount substrate;
    a light emitting element mounted on a surface of the mount substrate;
    a wavelength conversion layer for converting light emitted from the light emitting element to light having a predetermined wavelength;
    a light reflection member provided on the same surface of the mount substrate as the light emitting element, the light reflection member surrounding the light emitting element and the wavelength conversion layer; and
    a thin film provided on an outermost surface from which the light wavelength-converted by the wavelength conversion layer exits, the thin film having a coarse surface,
    wherein:
    the light emitting element comprises a light emitting layer, and light emitting surfaces of the light emitting element comprise an upper surface and side surfaces of the light emitting layer,
    the wavelength conversion layer has a plate shape,
    an upper surface of the wavelength conversion layer is a coarse surface,
    the thin film is directly formed on the coarse surface which is the upper surface of the wavelength conversion layer,
    the thin film has a shape that follows concavities and convexities of the coarse surface which is the upper surface of the wavelength conversion layer,
    an upper surface of the thin film is a coarse surface having concavities and convexities,
    the wavelength conversion layer is a plate made of an inorganic material which is one of (i) a mixture of or a sintered body of ceramic and a fluorescent material, (ii) a mixture of glass and a fluorescent material, (iii) ceramic on which a fluorescent material film is disposed, (iv) glass on which a fluorescent material film is formed, (v) fluorescent material dispersion glass, and (vi) a fluorescent material ceramic plate,
    the light reflection member is made from a material that includes a mixture of a resin material and a light reflection filler, the material being curable by heating or irradiation with ultraviolet rays,
    the thin film and the wavelength conversion layer are made of materials such that a contact angle of the thin film with respect to an uncured material of the light reflection member is larger than a contact angle of the wavelength conversion layer with respect to the uncured material of the light reflection member,
    the light reflection member directly contacts side surfaces of the light emitting element and directly contacts side surfaces of the wavelength conversion layer, and
    the light reflection member does not cover an upper surface of the thin film.

2. The semiconductor light emitting device according to claim 1, wherein the thin film is made of organic matter.

3. The semiconductor light emitting device according to claim 1, wherein the thin film is made of fluororesin.

4. The semiconductor light emitting device according to claim 1, wherein the thin film has a thickness from 1 nm to 10 μm.

5. The semiconductor light emitting device according to claim 1, wherein the resin material of the light reflection member is silicone resin.

6. The semiconductor light emitting device according to claim 5, wherein the thin film is made of organic matter.

7. The semiconductor light emitting device according to claim 5, wherein the thin film is made of fluororesin.

8. The semiconductor light emitting device according to claim 5, wherein the thin film has a thickness from 1 nm to 10 μm.

9. The semiconductor light emitting device according to claim 5, wherein a height of the light reflection member is maximized at a boundary between the wavelength conversion layer and the light reflection member.

10. The semiconductor light emitting device according to claim 5, wherein the light reflection member has a slope such that a height of the light reflection member is maximized at a boundary between the wavelength conversion layer and the light reflection member and is gradually reduced with distance from the wavelength conversion layer.

11. The semiconductor light emitting device according to claim 5, wherein:
    the light emitting element is rectangular in plan view and has a flip chip structure obtained by reversing the structure in which a semiconductor layer and a light emitting layer are laminated and a power supply electrode is formed on a substrate which is transparent for light to be emitted, and the power supply electrode of the light emitting element is conducted to a wiring pattern on the mount substrate.

12. The semiconductor light emitting device according to claim 1, wherein a height of the light reflection member is maximized at a boundary between the wavelength conversion layer and the light reflection member.

13. The semiconductor light emitting device according to claim 1, wherein the light reflection member has a slope such that a height of the light reflection member is maximized at a boundary between the wavelength conversion layer and the light reflection member and is gradually reduced with distance from the wavelength conversion layer.

14. The semiconductor light emitting device according to claim 1, wherein a lower surface of the wavelength conversion layer is adhered to an upper surface of the light emitting element.

15. The semiconductor light emitting device according to claim 1, wherein, in plan view, the wavelength conversion layer has the same size as an upper surface of the light emitting element.

16. The semiconductor light emitting device according to claim 15, wherein, in plan view, the thin film has the same size as an upper surface of the wavelength conversion layer.

17. The semiconductor light emitting device according to claim 1, wherein:
the light emitting element is rectangular in plan view and has a flip chip structure obtained by reversing a structure in which a semiconductor layer and a light emitting layer are laminated and a power supply electrode is formed on a substrate which is transparent for light to be emitted, and
the power supply electrode of the light emitting element is conducted to a wiring pattern on the mount substrate.

* * * * *